United States Patent [19]

Frey

[11] Patent Number: 4,552,607
[45] Date of Patent: Nov. 12, 1985

[54] METHOD OF MAKING ELECTRICALLY CONDUCTIVE THIN EPOXY BOND

[75] Inventor: Gregg W. Frey, Seattle, Wash.

[73] Assignee: Advanced Technology Laboratories, Inc., Bellevue, Wash.

[21] Appl. No.: 616,630

[22] Filed: Jun. 4, 1984

[51] Int. Cl.[4] .............................................. C09J 3/02
[52] U.S. Cl. .................................... 156/330; 156/276; 156/307.3
[58] Field of Search ...................... 156/330, 276, 307.3

[56] References Cited

U.S. PATENT DOCUMENTS

| | | | |
|---|---|---|---|
| 3,600,246 | 8/1971 | Breen | 156/265 |
| 3,923,581 | 12/1975 | Payne et al. | 156/330 |
| 3,930,975 | 1/1976 | Siegle et al. | 204/192 C |
| 3,990,926 | 11/1976 | Konicek | 156/330 |
| 4,210,704 | 7/1980 | Chandross et al. | 428/328 |
| 4,354,911 | 10/1982 | Dodd et al. | 427/304 |
| 4,383,003 | 5/1983 | Lifshin et al. | 428/631 |
| 4,407,883 | 10/1983 | Newton | 428/215 |
| 4,455,181 | 6/1984 | Lifshin et al. | 427/406 |

FOREIGN PATENT DOCUMENTS 9239  3/1978  United Kingdom ................ 156/330

Primary Examiner—Joseph L. Schofer
Assistant Examiner—N. Sarafim
Attorney, Agent, or Firm—Lawrence S. Levinson; Sanford J. Asman

[57] ABSTRACT

The present invention is a method and structure which produces extremely thin, electrically conductive epoxy bonds between two substrates. Copper microspheres, having an average diameter of about 2 microns are bound in an epoxy layer which bonds two substrates together. The microspheres make electrical contact between the substrates while providing intersphere gaps which are filled with the epoxy which actually bonds the substrates together.

3 Claims, 2 Drawing Figures

METHOD OF MAKING ELECTRICALLY CONDUCTIVE THIN EPOXY BOND

BACKGROUND OF THE INVENTION

The present invention relates to a method of bonding two conductive materials together with an epoxy and obtaining high quality electrical bonds therebetween.

In the manufacure of electronic devices, such as ultrasound transducers, it is often necessary to provide a means for electrically and mechanically attaching materials together, other than by soldering. In particular, in manufacturing ultrasound transducers, it is very important that very thin bonds be made. Heretofore, the use of so-called "conductive epoxies" has not been found to be suitable, because "conductive epoxies"do not provide adequate bond strenth, and the material in conductive epoxies is extremely non-uniform, resulting in uneven bonds which are not suitable for ultrasound transducers, as the mechanical properties of the bond affect the vibrational modes of the transducers.

Accordingly, it would be highly desirable to provide a bonding material which provides a thin, electrically conductive epoxy bond.

SUMMARY OF THE INVENTION

In accordance with the present invention, a method of providing a thin, electrically conductive bond between two substrates is presented. The method is comprised of bonding the substrates together using an epoxy to which electrically conductive microspheres have been added. In different embodiments of the invention, different methods of adding the microspheres to the epoxy are presented. The invention also comprises the composite material made in accordance with the inventive method.

DETAILED DESCRIPTION OF THE PREFERRED EMBODIMENT

Figure 1:
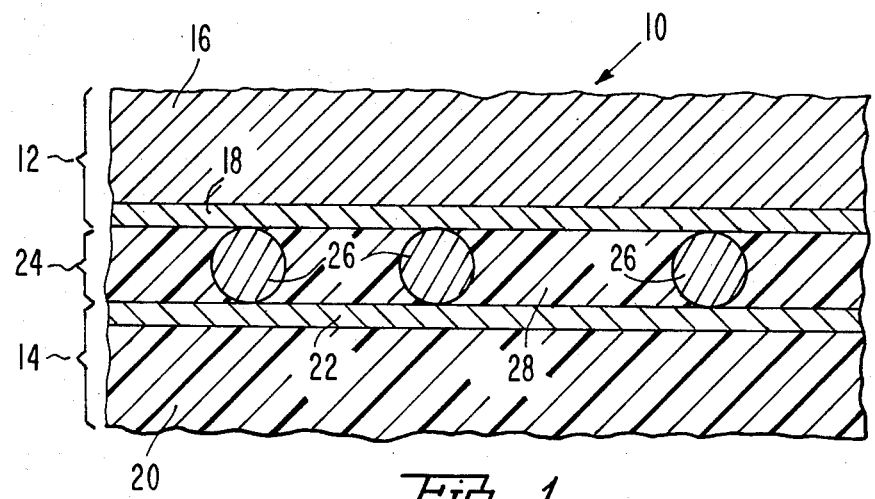
FIG. 1 illustrates a first embodiment of the present invention.

Referring to FIG. 1, a first embodiment 10 of the present invention is shown. In this embodiment 10, a pair of substrates 12, 14 are shown. The substrate 14 is comprised of a body of piezoelectric material 20 to which a conductive layer 22 has been applied. The substrate 12 is comprised of an electrically conductive body 16 to which a conductive layer 18 has been applied. In the preferred embodiment of the invention, the electrically conductive layers 18, 22 are comprised of chromium, which is sputtered onto the bodies 16, 20. The substrates 12, 14 are joined together by an electrically conductive epoxy bond 24 made in accordance with the present invention. As shown, the bond 24 is comprised of a series of electrically conductive microspheres 26 (herinafter generally called "spheres") which electrically connect the substrates 12, 14 together. The spheres 24 are bound in a non-conductive epoxy 28 which bonds the substrates 12, 14 together. Accordingly, the bond 24 is an epoxy bond formed by the epoxy 28 with the individual conductive spheres 26 bridging the thickness of the bond 24 to make electrical conduction between the two substrates 12, 14.

In accordance with the present invention, the conductive spheres 26 are preferably comprised of a fine copper powder having an average diameter of approximately 2 microns. Such powder is of the type obtained from Cerac, P.O. Box 1178, Milwaukee, Wis. 53201. In the first embodiment of the invention 10, the copper powder is comprised of atomized copper spheres 26 which are bound in the epoxy base 28, which is preferably comprised of Shell brand EPON 815 low viscosity epoxy using a Versamid 140 curing agent.

In the first embodiment of the invention 10, the atomized copper spheres 26 are applied to the surface 22 of the substrate 14. In order to insure that the bond 24 is extremely thin, the surfaces 18, 22 of the substrates 12, 14 are highly polished prior to epoxying them. In the embodiment 10, the spheres 26 are sprayed from a suspension onto the substrate 14 or 2% by weight of the copper spheres 26 are mixed into the epoxy material 28 prior to laminating the two substrates 12, 14.

An evaluation of methods used to produce conductive bonds was conducted. In the test, glass slides were sputtered with a thin conductive two layer film of nickel and chrome. First, nickel was sputtered directly onto the glass for adhesion. Then, chrome was sputtered onto the nickel to provide a conductive layer to which a bond could be made. In a first test, a conductive epoxy called Epotek H-20E, a silver epoxy was used to join two prepared slides together. In a second test, copper microspheres were sprayed on one slide prior to bonding in the manner of the present invention, and in a third test, 2% by weight of copper microspheres was mixed directly into the epoxy. The slides were arranged in a row side by side and a large cylindrical pressure applicator spanned the slides at the overlap joints.

The test was conducted at 60° Centigrade. It was found that the electrical resistance of the bonds made by either the copper microspheres or by the Epotek were essentially identical. However, the bond strength in the case of the Epotek was only about 45 pounds per square inch, while the bond strength provided by the present invention, i.e., epoxy mixed with microspheres, could not be measured due to glass failure.

The thickness of bonded joints employing epoxy mixed with microspheres was about 2.45 micrometers, whereas the Epotek joint was 12.25 micrometers thick. A joint thickness of 12.25 micrometers is too large for ultrasound transducer applications, at a frequency greater than about 7 MHz, as sound insertion losses causing severe bandwidth restrictions will occur.

Microphotographs of the joints showed that when microspheres were used there was a single microsphere spanning the bond, whereas when the conductive epoxy (Epotek) was used, many particles are loaded into the epoxy in order to insure conductivity, so the bond is extremely thick and uneven, and it is not useful for high frequency ultrasound applications.

Figure 2:
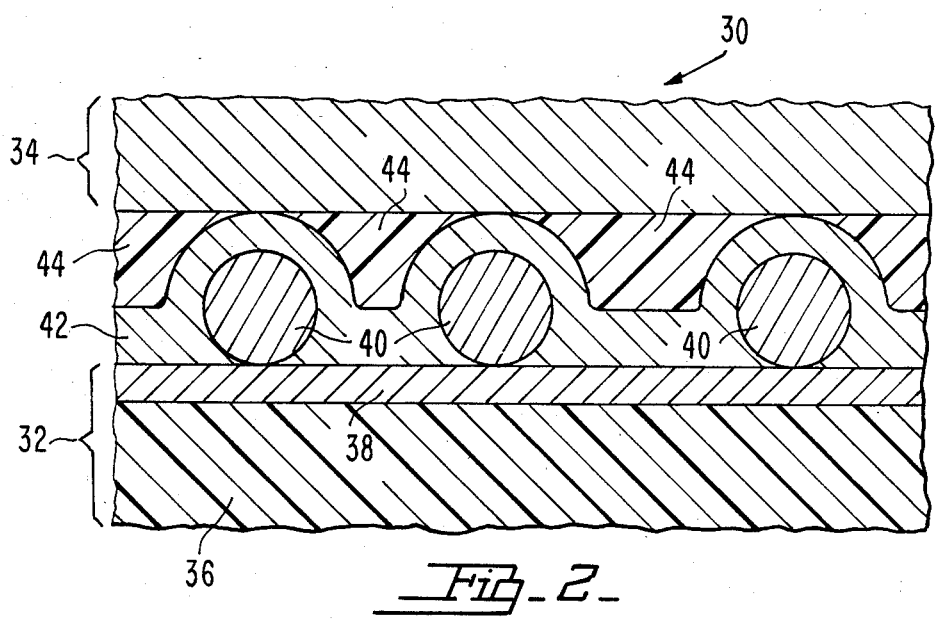
FIG. 2 illustrates a second embodiment of the present invention.

Referring now to FIG. 2, A second embodiment 30 of the present invention is shown. In the embodiment 30, a first substrate 32 is electrically connected to a second substrate 34. The first substrate 32 is comprised of a layer of piezoelectric material 36 having a sputtered chromium layer 38 applied thereon. Following the sputtering of layer 38 onto the layer of piezoelectric material 36, the atomized spheres copper spheres 40 are applied by any suitable means, such as by spraying them onto the sputtered layer 38. Then, an additional overcoat layer 42, preferably also of chromium, is sputtered onto the layer 38 with the spheres 40 thereon. As shown, second sputtered layer 42 conforms to the shape of the spheres 40. Accordingly, when the epoxy 44 is applied over the layer 42 and the second substrate 34 is pressed onto the epoxy 44, the epoxy 44 fills the gaps surrounding the spheres 40 thereby providing adhesion between the layers 38, 40, while electrical conductivity occurs through the layers 38, 42 and the spheres 40. The purpose of the spheres 40 in this embodiment 30 is to provide areas for the gaps for the epoxy 44 to fill while maintaining a very close spacing between the two substrates 32, 34.

It has been found that by using the copper spheres an "invisible" acoustic bond between the substrates can be formed for use in ultrasound transducer manufacturing. Accordingly, virtually any matching layers may be attached successfully to ceramic oscillators. Also, sheets of transducer materials may be fabricated, resulting in consistent, reproducible individual transducers.

As will be obvious to those of ordinary skill in the art, the present invention provides a much better bond than the prior art which utilized surface roughness of one or both of the substrates or prior conductive epoxy techniques.

I claim:

1. A method of providing a thin, electrically conductive bond between two conductive substrates comprising the step of bonding the substrates together using a non-conductive epoxy to which uniformly sized, electrically conductive microspheres have been added, whereby the bond thus formed will be made by the non-conductive epoxy, the bond thickness will corrrespond to the diameter of said microspheres, and electrical conductivity between said substrates will be provided by the conductive path formed by said microspheres.

2. A method of electrically bonding two bodies together comprising the steps of:
   (a) sputtering a conductive layer onto each of said substrates;
   (b) applying uniformly sized electrically conductive microspheres to said sputtered layer on one of said substrates; and
   (c) bonding said substrates together using a non-conductive epoxy, such that said sputtered layers are in electrical contact with said electrically conductive microspheres and said non-conductive epoxy bonds said substrates together, whereby the bond thus formed will by made by the non-conductive epoxy, the bond thickness will correspond to the diameter of said microspheres, and electrical conductivity between said substrates will be provided by the conductive path formed by said microspheres.

3. A method of electrically bonding two bodies together comprising the steps of:
   (a) sputtering a conductive layer onto one of said substrates;
   (b) applying uniformly sized electrically conductive microspheres onto said sputtered layer;
   (c) sputtering a second conductive layer onto said first sputtered layer overcoating said microspheres and leaving gaps between said overcoated microspheres;
   (d) filling said gaps with non-conductive epoxy; and
   (e) bonding said second body to said first body by applying said second body to said non-conductive epoxy, whereby electrical contact will occur through said sputtered layers and said microspheres.

* * * * *